US012575285B2

(12) United States Patent
Liu et al.

(10) Patent No.: US 12,575,285 B2
(45) Date of Patent: Mar. 10, 2026

(54) DISPLAY SUBSTRATE AND DISPLAY DEVICE HAVING AN ISOLATION GROOVE PROVIDED BETWEEN ADJACENT ELECTRODES

(71) Applicant: BOE Technology Group Co., Ltd., Beijing (CN)

(72) Inventors: Xiaoyun Liu, Beijing (CN); Liangliang Kang, Beijing (CN); Xiaohu Li, Beijing (CN); Juan Zhang, Beijing (CN); Qingyu Huang, Beijing (CN); Huajie Yan, Beijing (CN); Zhiqiang Jiao, Beijing (CN); Jiaqi Wei, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 488 days.

(21) Appl. No.: 17/769,765

(22) PCT Filed: Jun. 4, 2021

(86) PCT No.: PCT/CN2021/098417
§ 371 (c)(1),
(2) Date: Apr. 18, 2022

(87) PCT Pub. No.: WO2021/249309
PCT Pub. Date: Dec. 16, 2021

(65) Prior Publication Data
US 2022/0392968 A1 Dec. 8, 2022

(30) Foreign Application Priority Data
Jun. 12, 2020 (CN) .......................... 202010536226.9

(51) Int. Cl.
*H10K 59/35* (2023.01)

(52) U.S. Cl.
CPC .................................. *H10K 59/353* (2023.02)

(58) Field of Classification Search
CPC ..................................................... H10K 59/353
See application file for complete search history.

(56) References Cited

U.S. PATENT DOCUMENTS

2003/0201445 A1 10/2003 Park et al.
2007/0066178 A1* 3/2007 Yamada ............... H10K 50/828
445/24

(Continued)

FOREIGN PATENT DOCUMENTS

CN 101170856 A 4/2008
CN 102623644 A 8/2012

(Continued)

OTHER PUBLICATIONS

International Search Report for PCT/CN2021/098417 Mailed Sep. 3, 2021.

(Continued)

*Primary Examiner* — Norman D Richards
*Assistant Examiner* — Sean Ayers Winters
(74) *Attorney, Agent, or Firm* — Ling Wu; Stephen Yang; Ling and Yang Intellectual Property

(57) ABSTRACT

A display substrate and a display device. The display substrate comprises a base substrate and at least two first electrodes provided on one side of the base substrate and spaced apart; a pixel film layer is provided on the sides of the first electrodes away from the base substrate; a spacing area is formed between the adjacent first electrodes; an isolation recess is formed on the side of the spacing area away from the base substrate; the isolation recess electrically cuts off the pixel film layer on the adjacent first electrodes.

20 Claims, 3 Drawing Sheets

(56)                References Cited

U.S. PATENT DOCUMENTS

| | | | |
|---|---|---|---|
| 2009/0039773 A1 | 2/2009 | Jun et al. | |
| 2009/0289260 A1* | 11/2009 | Sonoda | G02F 1/133723 |
| | | | 438/34 |
| 2013/0134449 A1* | 5/2013 | Chen | H10K 59/1315 |
| | | | 438/34 |
| 2017/0278910 A1* | 9/2017 | Choi | H10K 59/122 |
| 2017/0352707 A1* | 12/2017 | Kim | H10K 59/122 |
| 2018/0190740 A1* | 7/2018 | Bang | H10K 59/122 |
| 2019/0363276 A1* | 11/2019 | Li | H10K 59/35 |
| 2020/0028122 A1* | 1/2020 | Hu | H10K 59/122 |

FOREIGN PATENT DOCUMENTS

| | | | |
|---|---|---|---|
| CN | 104538423 A | | 4/2015 |
| CN | 108493228 A | | 9/2018 |
| CN | 208797004 U | * | 4/2019 |
| CN | 110783481 A | | 2/2020 |
| CN | 111668380 A | | 9/2020 |
| KR | 2003-0084233 A | | 11/2003 |

OTHER PUBLICATIONS

Office Action dated Nov. 7, 2022 for Chinese Patent Application No. 202010536226.9 and English Translation.

* cited by examiner

| | |
|---|---|
| Second electrode | 154 |
| Second electron transport layer | 159 |
| First light-emitting layer | 153 |
| Second hole transport layer | 158 |
| Charge generation layer | 152 |
| First electron transporting layer | 157 |
| Second light-emitting layer | 156 |
| First hole transport layer | 155 |
| Hole injection layer | 151 |

DISPLAY SUBSTRATE AND DISPLAY DEVICE HAVING AN ISOLATION GROOVE PROVIDED BETWEEN ADJACENT ELECTRODES

CROSS-REFERENCE TO RELATED APPLICATIONS

The present application is a U.S. National Phase Entry of International Application PCT/CN2021/098417 having an international filing date of Jun. 4, 2021, which claims priority of Chinese Patent Application No. 202010536226.9, entitled "Display Substrate, Preparation Method Thereof, and Display Device" and filed on Jun. 12, 2020, the contents disclosed in the above-mentioned applications are hereby incorporated as a part of this application.

TECHNICAL FIELD

Embodiments of the disclosure relate, but are not limited, to the technical field of display, and in particular to a display substrate and a display device.

BACKGROUND

An existing micro organic light-emitting display device, such as a micro silicon-based organic light-emitting display (OLED) device, use a monocrystalline silicon chip as a base substrate, has a pixel size being 1/10 of that of a conventional display device, and a fineness much higher than that of the conventional device, so the micro silicon-based OLED device can be used for forming micro displays. Silicon-based OLED micro displays have broad space of market application, are especially suitable for helmet-mounted displays, stereoscopic mirrors and glasses type displays. If the micro silicon-based OLED device is communicated with a mobile communication network, satellite positioning system and other systems, accurate image information can be obtained anywhere and at any time, which has very important military value in military applications such as national defense, aviation, aerospace and even individual combat. A micro-OLED micro display can provide high-quality video displaying for mobile information products such as portable computers, wireless Internet browsers, portable DVDs, game platforms and wearable computers. Generally, micro silicon-based OLED micro displays provide an excellent solution for near-eye applications (such as helmet-mounted display) in civil consumer field, industrial applications and even military applications, and are expected to bring a new trend of near-eye displaying in military and consumer electronics fields.

A micro silicon-based OLED display device has a very small pixel size, high Pixels Per Inch (PPI), and small interval between adjacent pixels, and wherein an interval distance is usually less than 1 micron, which will lead to the problem of transverse current crosstalks between adjacent pixels and cause color cross of the display device. For example, when a pixel displays a signal, part of the display current is transported to an adjacent pixel thereof, so that the adjacent pixel cannot display a predetermined pixel gray tone, which greatly affects display effects of the micro silicon-based OLED display device.

SUMMARY

The following is a summary of subject matters described in the present disclosure in detail. The summary is not intended to limit the scope of protection of claims.

In first aspect, the embodiments of the present disclosure provide a display substrate, including a base substrate and at least two first electrodes provided at intervals on one side of the base substrate, a pixel film layer is provided on one side of the first electrodes away from the base substrate, an interval region is formed between adjacent first electrodes, and an isolation groove is provided on one side of the interval region away from the base substrate, and the isolation groove electrically cuts off the pixel film layer on the adjacent first electrodes.

In an exemplary implementation, isolation posts are provided on one side of the at least two first electrodes away from the base substrate, each isolation post is located at one side of a first electrode close to the interval region, and the isolation groove is formed in the interval region between isolation posts of the adjacent first electrodes.

In an exemplary implementation, each isolation post has a first sidewall of one side close to the isolation groove, and an included angle between the first sidewall and the base substrate is not less than 80 degrees.

In an exemplary implementation, an isolation post has a second sidewall on one side away from the isolation groove, and an internal angle between the second sidewall and a surface of the first electrode away from the base substrate is less than 60 degrees.

In an exemplary implementation, a distance between a surface of the isolation post on one side away from the base substrate and a surface of the first electrode on the side away from the base substrate is 200 angstroms to 2000 angstroms.

In an exemplary implementation, the base substrate includes at least two sub-pixel regions and a non-display region located between adjacent sub-pixel regions, and an orthographic projection of the isolation posts on the base substrate overlaps with that of the non-display region.

In an exemplary implementation, the pixel film layer includes a charge generation layer provided on the side of the first electrodes away from the base substrate, and a surface of the charge generation layer on the side away from the base substrate is not higher than a surface of an isolation post on the side away from the base substrate.

In an exemplary implementation, the pixel film layer further includes a light-emitting layer provided on one side of the charge generation layer away from the base substrate and a second electrode provided on one side of the light-emitting layer away from the base substrate, a surface of the light-emitting layer away from the base substrate is higher than a surface of the isolation post away from the base substrate.

In an exemplary implementation, an insulating layer covering the base substrate is provided between the first electrodes and the base substrate, and a thickness of the pixel film layer is equal to a sum of a thickness of the insulating layer and a thickness of a first electrode.

In an exemplary implementation, an insulating layer covering the base substrate is provided between the first electrodes and the base substrate, and the isolation groove recessed inwardly is formed on the insulating layer in the interval region between the adjacent first electrodes.

In an exemplary implementation, the isolation groove has a sidewall and a bottom wall, and an included angle between the sidewall and the bottom wall is not less than 80 degrees.

In an exemplary implementation, a depth of the isolation groove is not larger than 2000 angstroms.

In an exemplary implementation, isolation posts are provided on the side of the at least two first electrodes away from the base substrate, each isolation post is located on one side of a first electrode close to the interval region, a first groove is formed in the interval region between adjacent isolation posts, an insulating layer covering the base substrate is provided between the at least two first electrodes and the base substrate; the insulating layer on the interval region between the adjacent first electrodes is provided with a second groove recessed inwardly, the first groove and the second groove are combined to form the isolation groove.

In second aspect, an embodiment of the present disclosure further provides a display device, including any one of the display substrates described above.

Other aspects may be understood upon reading and understanding of the drawings and the detailed description.

DETAILED DESCRIPTION

Figure 1:
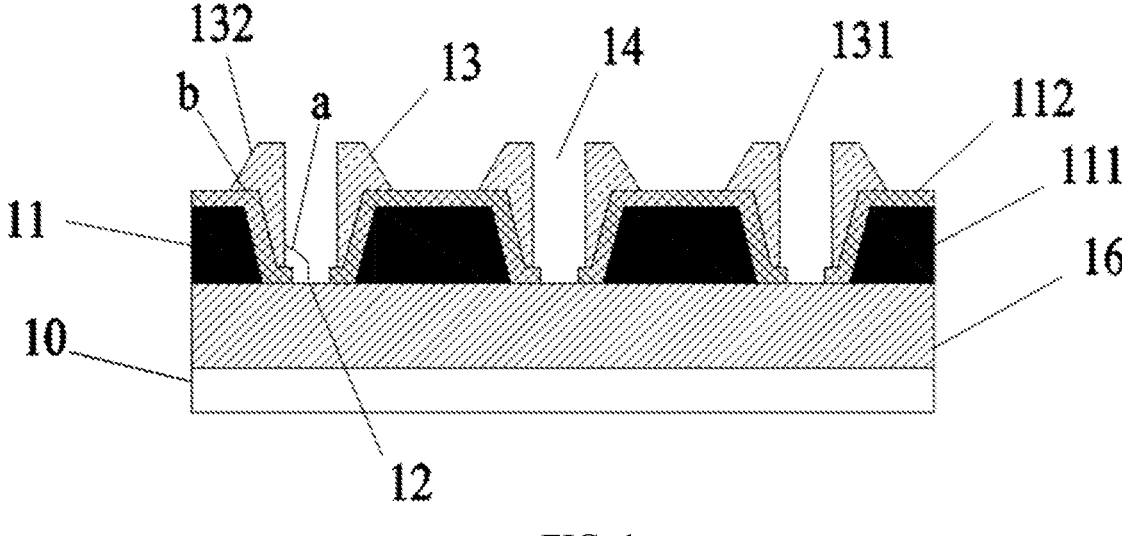
FIG. 1 is a first schematic diagram of a display substrate after an isolation groove is formed according to the present disclosure.

Embodiments of the present disclosure will be described in detail below with reference to the drawings. It is noted that implementation modes may be implemented in at least two different forms. Those of ordinary skills in the art can easily understand such a fact that implementation modes and contents may be transformed into various forms without departing from the purpose and scope of the present disclosure. Therefore, the present disclosure should not be explained as being limited to the contents recorded in the following implementation only. The embodiments in the present disclosure and features in the embodiments may be combined with each other randomly in a case of no conflict.

In the specification, for sake of convenience, wordings indicating orientations or positional relationships, such as "center", "upper", "lower", "front", "back", "vertical", "horizontal", "top", "bottom", "inside", and "outside", are used for describing positional relationships between constituent elements with reference to the drawings, and are merely for facilitating describing the specification and simplifying the description, rather than indicating or implying that referred devices or elements must have particular orientations, and be constructed and operated in particular orientations. Thus, they cannot be construed as limitations on the present disclosure. The position relationship between the constituent elements may be appropriately varied according to directions according to which the constituent elements are described. Therefore, appropriate replacements based on situations are allowed, which are not limited to the wordings in this specification.

Unless otherwise specified and limited, in this specification terms "mount", "connected" and "connect" should be understood in a broad sense. For example, a connection may be a fixed connection, a removable connection, or an integrated connection, it may be a mechanical connection or an electrical connection, it may be a direct connection, an indirect connection through an intermediate component, or internal communication between two components. For those of skills in the art, meanings of the above terms in the present disclosure may be understood according to situations.

In the present disclosure, "about" refers to that a boundary is defined not so strictly and numerical values in process and measurement error ranges are allowed.

Top emission electro luminescence structures are widely used in mobile products due to their high aperture ratios and high brightness of products. For silicon-based OLED display products, top emission electro luminescence is the only choice. Due to limitations of current masks, it is difficult for a current RGB-structure product to exceed 1000 PPI, and white organic electro luminescent devices (WOLED) plus color filter substrates (CF) enable the product to reach thousands of PPI. Top emission devices have strong microcavity effects. General top emission white light devices give priority in considering weaken microcavity effect, so that red, green and blue can evenly emit light, which put higher requirement on cathodes of devices. At present, magnesium (Mg): silver (Ag) composite cathodes have been mass-produced in the industry. Transmittance of this cathode structure is only about 50%, and the microcavity effect is obvious. In addition, a color filter substrate has selectivity to light, which result in low brightness of the final product.

A microcavity effect formula is as follows:

$$|E(\lambda)|^2 = \frac{(1-R_2)\left[1+R_1+2\sqrt{R_1}\cos\left(\frac{4\pi Z}{\lambda}\right)\right]}{1+R_1R_2-2\sqrt{R_1R_2}\cos\left(\frac{4\pi L}{\lambda}\right)}|I_0(\lambda)|^2$$

In the microcavity effect formula, a reflectivity of a reflecting mirror P1 is R1, a reflectivity of a transflective mirror P2 is R2, an optical path between the reflecting mirror P1 and the transflective mirror P2 is L, an optical path from the luminescence center to P1 is Z, and light intensity at the luminescence center is $I_0$.

In a micro silicon-based OLED display device, for a single white light-emitting layer (single) devices, in order to reduce a startup voltage of the device, in addition to improving an anode injection work function, it is required to inject hole injection layer (HIL) material with good performance. The hole injection layer (HIL) material has high conductivity. Because cathodes of organic electro luminescent materials are shared, a case that peripheral pixels lights up when being lighted usually occurs, which will cause a phenomenon of color cross for pixel arrangements such as BV3 or real RGB, resulting in a decrease in color gamut of products.

In addition to the highly conductive hole injection layer (HIL), a charge generation layer (CGL) is introduced to a tandem device. For TV and other products with low Pixels Per Inch (PPI), crosstalk of the charge generation layer is usually solved by reducing the electrical properties of charge generation layer or increasing spacing between pixel film layers. Due to limitations of the spacing between pixel film layers of a silicon-based product, and the brightness of such products is 10 times or even higher than that of a TV, the working voltage and power consumption of the product will increase after the electricity of the charge generation layer is reduced, which also aggravates difficulty of cross-voltage design of complementary metal oxide semiconductors (CMOS).

An embodiment of the present disclosure provide a display substrate, including a base substrate and at least two first electrodes provided at intervals on one side of the base substrate, a pixel film layer is provided on one side of the first electrodes away from the base substrate, an interval region is formed between the adjacent first electrodes, and an isolation groove is provided on one side of the interval region away from the base substrate, wherein the isolation groove electrically cuts off the pixel film layer on the adjacent first electrodes.

The base substrate of the embodiment of the present disclosure forms the isolation groove on the interval region between the adjacent first electrodes, so that a segment difference is formed between the isolation groove and the first electrode, therefore in a process of forming the pixel film layer, the isolation groove can block a transverse current between the pixel film layers on the adjacent first electrodes, that is, the isolation groove can block a hole injection layer and a charge generation layer in the pixel film layers on the adjacent first electrodes, so as to electrically cut off the pixel film layers on the adjacent first electrodes and prevent crosstalk between the pixel film layers on the adjacent first electrodes.

FIG. 1 is a first schematic diagram of a display substrate after an isolation groove is formed according to the present disclosure. As shown in FIG. 1, the display substrate of the embodiment of the present disclosure is an organic light emitting diode display substrate, including a base substrate 10 and at least two first electrodes 11 provided on one side of the base substrate 10, wherein the at least two first electrodes 11 are provided at intervals. The first electrodes 11 may be anodes. Adjacent first electrodes 11 are disconnected from each other to form an interval region 12. Isolation posts 13 are provided on one side of the at least two first electrodes 11 away from the base substrate 10, the isolation posts 13 are located on one side of the first electrodes 11 close to the interval region 12. The isolation posts 13 of adjacent first electrodes 11 form an isolation groove 14 in the interval region 12, that is, the isolation posts 13 on the adjacent first electrodes 11 enclose the isolation groove 14 in the interval region 12. Isolation posts 13 are provided on two opposite sides of at least one of the first electrodes 11. The isolation posts 13 on the two opposite sides of one first electrode 11 form a pixel opening, which expose the first electrode 11. A pixel film layer (not shown in the figure) is provided on the pixel opening. In the embodiment of the present disclosure, a segment difference is formed between the isolation groove 14 and the first electrode 11, so that the pixel film layers on the adjacent first electrodes 11 can be cut off, so as to block the transverse current of the pixel film layers on the adjacent first electrodes 11 and prevent crosstalk between the pixel film layers on the adjacent first electrodes.

In an exemplary implementation, the isolation posts 13 may be provided on two sides of the first electrode 11, or the isolation posts 13 may be provided on one side of the first electrode 11, as long as the isolation posts 13 of an adjacent first electrode 11 can form the isolation groove 14 in the interval region 12.

As shown in FIG. 1, the present disclosure shows that the base substrate may be of top emission type. A first electrode 11 in the embodiment of the present disclosure includes a contact electrode 111 provided on one side of the base substrate 10 and a reflective electrode 112 provided on one side of the contact electrode 111 away from the base substrate 10. The contact electrodes 111 of adjacent first electrodes 11 are disconnected from each other, and the reflective electrodes 112 of the adjacent first electrodes 11 are disconnected from each other. In a case that a light emitting mode of the display substrate is top emission, the first electrodes 11 may be transparent electrodes or translucent electrodes.

In an exemplary implementation, types and materials of the first electrodes are not limited. For example, the first electrodes may be formed by a transparent conductive material with a high work function, and the materials of the electrodes may include indium tin oxide (ITO), indium zinc oxide (IZO), indium gallium oxide (IGO), gallium zinc oxide (GZO), zinc oxide (ZnO), indium oxide (In2O3), aluminum zinc oxide (AZO), carbon nanotubes and the like.

In an exemplary implementation, a protective layer (not shown) is provided on the side of the first electrodes away from the base substrate 10 for protecting the first electrodes. For example, the protective layer is a PR protective layer.

In an exemplary implementation, the base substrate 10 includes at least two sub-pixel regions and a non-display region located between adjacent sub-pixel regions. An orthographic projection of the pixel opening on the base substrate 10 overlaps with the sub-pixel region. An orthographic projection of the isolation posts 13 on the base substrate 10 overlaps with the non-display region to prevent the isolation posts 13 from shielding the sub-pixel regions and reducing the area of the pixel opening. The design process is simple, efficient and accurate, which improves an overall light-emitting efficiency of the device and is suitable for the field of ultra-high micro display.

In an exemplary implementationa material of the isolation posts 13 may be an inorganic material. For example, silicon nitride (SiNx) or silicon oxide (SiOx) may be used as the material of the isolation posts 13.

As shown in FIG. 1, an isolation post 13 has a first sidewall 131 on one side close to the isolation groove 14, and an included angle α between the first sidewall 131 and a surface of the base substrate 10 close to the first electrode 11 is not less than 80 degrees. For example, the included angle a is 90 degrees. Therefore, it is ensured that the pixel film layer breaks at the first sidewall 131 in a process of forming the pixel film layer on the first electrode 11, so that the transverse current of the pixel film layers on the adjacent first electrodes 11 is blocked.

As shown in FIG. 1 the isolation post 13 has a second sidewall 132 on one side away from the isolation groove 14, and an internal angle b between the second sidewall 132 and a surface of the first electrode 11 away from the base substrate 10 is less than 60 degrees, for example, the internal angle b is 45 degrees. Thus, it is ensured that the second electrode (cathode) in the pixel film layer does not break in the process of forming the pixel film layer on the first electrode 11.

In an exemplary implementation, a cross section of the isolation post may have a variety of shapes, such as polygons like a regular trapezoid, an inverted trapezoid, a rectangle, a regular hexagon, or other regular or irregular shapes, which will not be repeated here in this embodiment.

In an exemplary implementation, a distance between a surface of the isolation post away from the base substrate and a surface of the first electrode away from the base substrate is 200 angstroms to 2000 angstroms, so as to ensure that the isolation groove formed by the isolation post can block the transverse current of the adjacent pixel film layers and that the second electrode (cathode) in the pixel film layer does not break.

Figure 2:
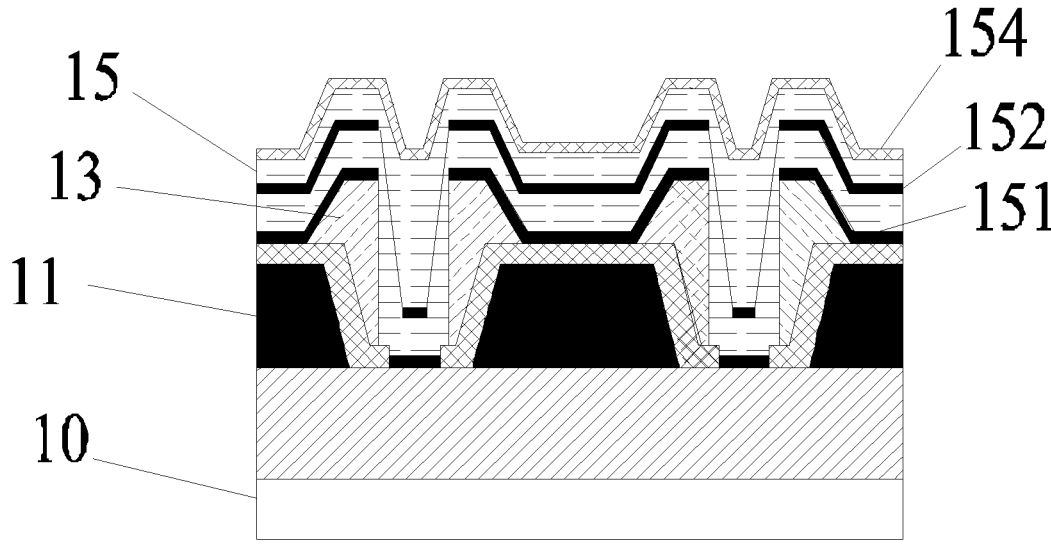
FIG. 2 is a schematic diagram of a display substrate after a pixel film layer is formed according to an embodiment of the present disclosure.

FIG. 2 is a schematic diagram of a display substrate after a pixel film layer is formed according to an embodiment of the present disclosure. As shown in FIG. 2, a pixel film layer 15 is provided on one side of a first electrode 11 away from the base substrate 10. The pixel film layer 15 is connected with the first electrode 11 exposed by a pixel opening. The pixel film layer 15 at least includes a hole injection layer 151 provided on one side of the first electrode 11 away from the base substrate 10. A surface of the hole injection layer 151 away from the base substrate 10 is not higher than a surface of an isolation post 13 away from the base substrate 10, thereby it is ensured that the hole injection layer 151 can be cut off by the isolation groove.

As shown in FIG. 2, the pixel film layer 15 further includes a charge generation layer 152 provided on one side of the hole injection layer 151 away from the base substrate 10, and a surface of the charge generation layer 152 away from the base substrate 10 is not higher than the surface of the isolation post 13 away from the base substrate 10. For example, the surface of the charge generation layer 152 away from the base substrate 10 is flush with the surface of the isolation post 13 away from the base substrate 10. Thereby it is ensured that the charge generation layer 152 is cut off by the isolation groove.

In an exemplary implementation, the charge generation layer includes a first generation layer and a second generation layer which are stacked, wherein the first generation layer is located on one side close to the base substrate, the second generation layer is located on one side away from the base substrate, and a surface of the second generation layer away from the base substrate is not higher than the surface of the isolation post away from the base substrate.

As shown in FIG. 2, the pixel film layer 15 further includes a light-emitting layer provided on the side of the charge generation layer 152 away from the base substrate 10 and a second electrode 154 provided on one side of the light-emitting layer away from the base substrate 10. For example, the second electrode 154 may be a cathode. A surface of the light-emitting layer away from the base substrate 10 is higher than the surface of the isolation post 13 away from the base substrate 10. Thereby it is ensured that the second electrode 154 is not cut off by the isolation groove and the second electrode 154 will not break.

As shown in FIG. 1, an insulating layer 16 covering the base substrate 10 is provided between the first electrode 11 and the base substrate 10, wherein a thickness of the pixel film layer is equal to a sum of a thickness of the insulating layer 16 and a thickness of the first electrode 11, thereby weakening the microcavity effect.

Figure 3:
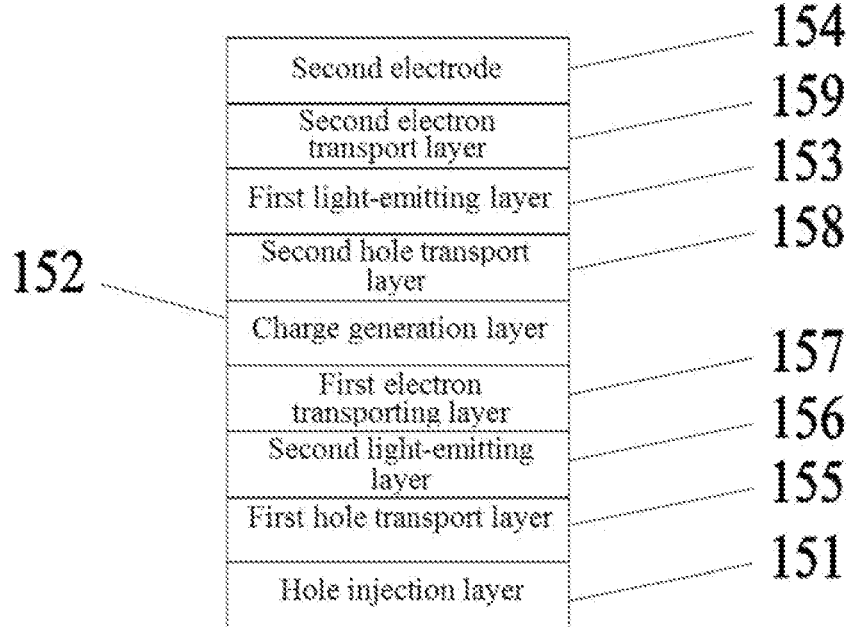
FIG. 3 is a schematic diagram of a structure of a pixel film layer in a display substrate according to an embodiment of the present disclosure.

FIG. 3 is a schematic diagram of a structure of a pixel film layer in a display substrate according to an embodiment of the present disclosure. As shown in FIG. 3, the pixel film layer 15 includes a hole injection layer 151 provided on one side of the first electrode away from the base substrate, a first hole transport layer 155 provided on one side of the hole injection layer 151 away from the base substrate, a second light-emitting layer 156 provided on one side of the first hole transport layer 155 away from the base substrate, a first electron transport layer 157 provided on one side of the second light-emitting layer 156 away from the base substrate, a charge generation layer 152 provided on one side of the first electron transport layer 157 away from the base substrate, a second hole transport layer 158 provided on one side of the charge generation layer 152 away from the base substrate, a first light-emitting layer 153 provided on one side of the second hole transport layer 158 away from the base substrate, a second electron transport layer 159 provided on one side of the first light-emitting layer 153 away from the base substrate, and a second electrode 154 provided on one side of the second electron transport layer 159 away from the base substrate.

In the pixel film layer structure described above, the charge generation layer 152 may include a first generation layer and a second generation layer. The first generation layer may be an N-type charge generation layer, and the second generation layer may be a P-type charge generation layer. The N-type charge generation layer includes a metal material (e.g. Li, Mg, Ca, Cs, Yb). The P-type charge generation layer is composed of a metal oxide (e.g. ITO, WO3, MoO3, V2O5, ReO3), or a hole transporting material doped with Lewis acid (e.g. FeCl3: NPB, F4-TCNQ: NPB), or a P-type organic material (e.g. HATCN). The N-type charge generation layer can improve injection and migration characteristics of electrons, thus reducing the driving voltage and improving the efficiency and lifetime of the device.

In the pixel film layer structure described above, the first hole transport layer 155 and the second hole transport layer 158 may function in promoting the transportation of holes. Materials of the first hole transport layer 155 and the second hole transport layer 158 may include any one selected from the group consisting of: for example, NPD (N, N-dinaphthyl-N, N '-diphenylbenzidine) (N, N'-bis(naphth-1-yl)-N, N '-bis(phenyl)-2, 2'-dimethylbenzidine), TPD (N, N '-bis-(3-methylphenyl)-N, N'-bis-(phenyl)-benzidine), and MTDATA (4, 4 ', 4-tris (N-3-methylphenyl-N-phenyl-amino)-triphenylamine). However, this embodiment is not limited thereto.

In the pixel film layer structure described above, the hole injection layer 151 can promote the injection of holes. The hole implantation layer 151 may be made of at least one selected from the group consisting of: for example, CuPc (copper phthalocyanine), PEDOT (poly (3, 4)-ethylene dioxythiophene), PANI (polyaniline), NPD (N, N-dinaphthyl-N, N'-diphenylbenzidine) and combinations thereof. However, this embodiment is not limited thereto.

In the pixel film layer structure described above, the first electron transport layer 157 and the second electron transport layer 159 receive electrons from the second electrode and can transfer the supplied electrons to the light-emitting layer. The first electron transport layer 157 and the second electron transport layer 159 are also used for promoting the transportation of electrons. Materials of the first electron transport layer 157 and the second electron transport layer 159 may include at least one selected from the group consisting of: for example, Alq3 (tris (8-hydroxyquinoline) aluminum), Liq (8-hydroxyquinoline lithium), PBD (2-(4-biphenyl)-5-(4-tert-butylphenyl)-1, 3, 4-diazole), TAZ (3-(4-biphenyl)-4-phenyl-5-tert-butylphenyl-1, 2, 4-triazole), spiro-PBD, BAlq (bis (2-methyl-8-quinoline)-4-(phenylphenol) aluminum), SAlq, TPBi (2, 2 ', 2-(1, 3, 5-phenyltriyl)-tris (1-phenyl-1-H-benzimidazole) Riyl)-tris (1-phenyl-1-H-benzimidazole)), diazole, triazole, phenanthroline, benzoazole and benzothiazole. However, this embodiment is not limited thereto.

In the pixel film structure described above,, the second electrode 154 may be formed by a material with high conductivity and low work function, for example, the material of the second electrode 154 may include an alloy such as magnesium aluminum alloy (MgAl), lithium aluminum alloy (LiAl) or a single metal such as magnesium, aluminum, lithium, silver, etc.

The technical solution of this embodiment is further described below through a process for preparing the display substrate in this embodiment. A "patterning process" described in the embodiment includes processing such as depositing of a film layer, coating with a photoresist, mask exposure, development, etching, and stripping of the photoresist. A "lithography process" described in the embodiment of the present disclosure includes processing such as coating of a film layer, mask exposure, and development, and the evaporation, deposition, coating, spreading and the like mentioned in this embodiment are all mature preparation processes in the related art.

A preparation process of the display substrate may include the following steps:

1) An insulating layer 16 is formed on a base substrate 10, a metal thin film is deposited on the insulating layer 16, the metal film is patterned by a patterning process, at least two first electrodes 11 are formed on one side of the insulating layer 16 away from the base substrate 10, wherein the at least two first electrodes 11 are provided at intervals. Adjacent first electrodes 11 are disconnected from each other, and an interval region 12 is formed between the adjacent first electrodes 11. A PR protective film (not shown in the figure) is formed on one side of the first electrodes 11 away from the base substrate 10 as shown in FIG. 1. Herein, the metal thin film may be made of a transparent conductive material with high work function, wherein the material of the metal thin film may include indium tin oxide (ITO), indium zinc oxide (IZO), indium gallium oxide (IGO), gallium zinc oxide (GZO), zinc oxide (ZnO), indium oxide ($In2O3$), aluminum zinc oxide (AZO) and carbon nanotubes and the like.

2) An isolation material layer covering the entire base substrate 10 is coated on the side of the first electrodes 11 away from the base substrate 10, the isolation material layer is dry-etched by an etching process to remove the isolation material layer on the interval region 12 and partially remove the isolation material layer on the first electrodes 11, and the residual isolation material layer on each first electrode 11 forms an isolation post 13. The isolation post 13 is located on one side of the first electrode 11 close to the interval region 12, and adjacent isolation posts 13 form an isolation groove 14 in the interval region 12. The isolation posts 13 are provided on two opposite sides of at least one of the first electrodes 11. The isolation posts 13 on the two opposite sides of the one first electrode 11 form a pixel opening, which exposes the first electrode 11, as shown in FIG. 1. Herein, a thickness of the isolation material layer is 200 angstroms to 2000 angstroms, and a material of the isolation material layer may be an inorganic material. A width and a depth of the isolation groove 14 may be set according to a thickness of a pixel film layer, as long as it is ensured that the isolation groove 14 can block the hole injection layers and the charge generation layers in the adjacent pixel film layers without breaking the second electrode.

3) A pixel film layer 15 is formed on the side of the first electrodes 11 away from the base substrate 10 by a mask process. Herein, the pixel film layer 15 at least includes a hole injection layer 151 provided on the side of the first electrodes away from the base substrate, a first hole transport layer 155 provided on one side of the hole injection layer 151 away from the base substrate, a second light-emitting layer 156 provided on one side of the first hole transport layer 155 away from the base substrate, a first electron transport layer 157 provided on one side of the second light-emitting layer 156 away from the base substrate, a charge generation layer 152 provided on one side of the first electron transport layer 157 away from the base substrate, a second hole transport layer 158 provided on one side of the charge generation layer 152 away from the base substrate, a first light-emitting layer 153 provided on one side of the second hole transport layer 158 away from the base substrate, a second electron transport layer 159 provided on one side of the first light-emitting layer 153 away from the base substrate, and a second electrode 154 provided on one side of the second electron transport layer 159 away from the base substrate, wherein the hole injection layer 151 and charge generation layer 152 in the pixel film layer is cut off by the isolation groove 14. The second electrode 154 in the pixel film layer 15 is not cut off by the isolation groove 14, as shown in FIG. 2 and FIG. 3.

4) An encapsulation layer is formed on the pixel film layer to encapsulate the pixel film layer.

5) A low-temperature color filter structure layer is formed on the encapsulation layer to achieve display effects.

Figure 4:
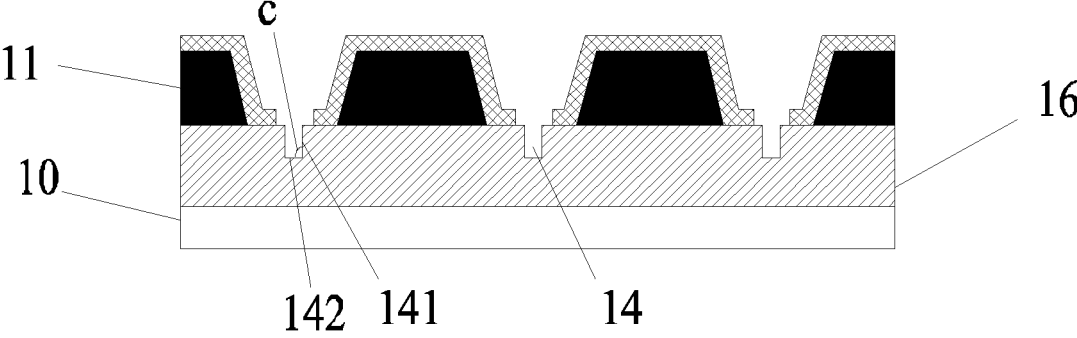
FIG. 4 is a second schematic diagram of a display substrate after an isolation groove is formed according to an embodiment of the present disclosure.

FIG. 4 is a second schematic diagram of a display substrate after an isolation groove is formed according to an embodiment of the present disclosure. FIG. 4 illustrates an exemplary implementation of a display substrate according to an embodiment of the present disclosure. As shown in FIG. 4, a main body structure of the display substrate of the embodiment of the present disclosure is substantially the same as that of the display substrate of the aforementioned embodiment, except that an insulating layer 16 covering the base substrate 10 is provided between the first electrode 11 and the base substrate 10, and an insulating groove 14 recessed inwardly is provided on the insulating layer 16 on the interval region between adjacent first electrodes 11. A segment difference is formed between the isolation groove 14 and the first electrodes 11 to ensure that the transverse current of the pixel film layers on the adjacent first electrodes 11 is blocked and the crosstalk between the pixel film layers on the adjacent first electrodes is prevented.

As shown in FIG. 4, the isolation groove 14 has sidewalls 141 and a bottom wall 142, wherein an included angle c between a sidewall 141 and the bottom wall 142 is not less than 80 degrees. For example, the included angle c between the sidewall 141 and the bottom wall 142 is 90 degrees. The included angle c between the sidewall 141 and the bottom wall 142 is not less than 80 degrees to ensure that the pixel film layer breaks at the isolation groove 14 during the formation of the pixel film layer, thereby achieving blocking of the transverse current of the pixel film layers on the adjacent first electrodes 11.

In an exemplary implementation, a depth of the isolation groove is not greater than 2000 angstroms to ensure that the isolation groove can block the transverse current of the adjacent pixel film layers and that the second electrode (cathode) in the pixel film layer does not break.

Figure 5:
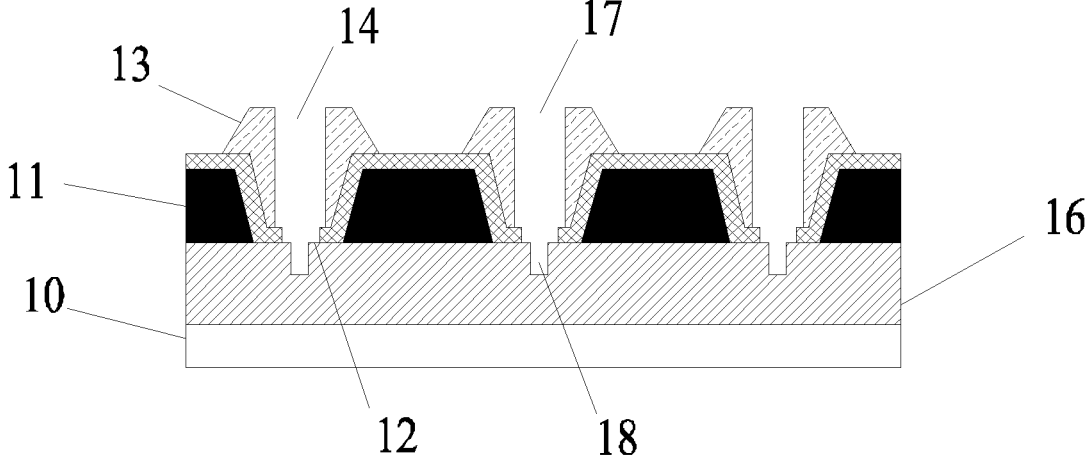
FIG. 5 is a third schematic diagram of a display substrate after an isolation groove is formed according to an embodiment of the present disclosure.

FIG. 5 is a third schematic diagram of a display substrate after an isolation groove is formed according to an embodiment of the present disclosure. FIG. 5 illustrates an exemplary implementation of a display substrate according to an embodiment of the present disclosure. As shown in FIG. 5, a main body structure of the display substrate of the embodiment of the present disclosure is substantially the same as that of the display substrate of the aforementioned embodiment, except that isolation posts 13 are provided on the side of the at least two first electrodes 11 away from the base substrate 10, wherein each isolation post 13 is located on one side of a first electrode 11 close to the interval region 12, and a first groove 17 is formed on an interval region between adjacent isolation posts 13. An insulating layer 16 covering the base substrate 10 is provided between the first electrodes 11 and the base substrate 10, and a second groove 18 recessed inwardly is provided in the insulating layer 16 on the interval region between adjacent first electrodes 11. An orthographic projection of the second groove 18 on the base substrate 10 is within an orthographic projection of the first groove 17 on the base substrate 10. The first groove 17 and the second groove 18 are combined to form the isolation groove 14.

In an exemplary implementation, shapes and sizes of the isolation posts 13 in the embodiment of the present disclosure are the same as the shapes and sizes of the isolation post in the display substrate shown in FIG. 1, which will not be repeated here in this embodiment.

In an exemplary implementation, the second groove 18 in the embodiment of the present disclosure has the same shape and size as the isolation groove in the display substrate shown in FIG. 4, which will not be repeated here in this embodiment.

In a process of forming the isolation groove 14, the isolation posts 13 are formed on the first electrodes 11, and then a second groove 18 is formed on the insulating layer 16. Alternatively, a second groove 18 is formed on the insulating layer 16, and then the isolation posts 13 are formed on the first electrodes 11.

An embodiment of the present disclosure further provides a method for preparing a display substrate, including steps of:

S1, at least two first electrodes are formed on one side of a base substrate, and the at least two first electrodes are provided at intervals, so that an interval region is formed between adjacent first electrodes;

S2, an isolation groove is formed on the interval region; and

S3, a pixel film layer is formed on the first electrodes, and the pixel film layer on the adjacent first electrodes is electrically cut off by the isolation groove.

In an example implementation, step S2 includes:

Isolation posts are formed on one side of the first electrodes away from the base substrate, and the isolation posts are located on sides of the first electrodes close to the interval region, so that adjacent isolation posts form the isolation groove in the interval region.

In an exemplary implementation, the method for preparing the display substrate of the embodiment of the present disclosure includes:

S1, an insulating layer covering the base substrate is formed on one side of the base substrate;

S2, at least two first electrodes are formed on one side of the insulating layer away from the base substrate, and the at least two first electrodes are provided at intervals, so that an interval region is formed between adjacent first electrodes; and S3, the insulating groove recessed inwardly is formed in the insulating layer 16 on the interval region between the adjacent first electrodes.

In an exemplary implementation, the method for preparing the display substrate of the embodiment of the present disclosure includes:

S1, an insulating layer covering the base substrate is formed on one side of the base substrate;

S2, at least two first electrodes are formed on one side away from the base substrate, and the at least two first electrodes are provided at intervals, so that an interval region is formed between adjacent first electrodes; and S3, isolation posts are formed on one side of the at least two first electrodes away from the base substrate, the isolation posts are located on sides of the at least two first electrodes close to the interval region, so that the adjacent isolation posts form a first groove in the interval region; and S4, a second groove is formed in the insulating layer on the interval region between adjacent ones of the at least two first electrodes, and the first groove is combined with the second groove to form the isolation groove.

In an exemplary implementation, the method for preparing the display substrate of the embodiment of the present disclosure includes:

S1, an insulating layer covering the base substrate is formed on one side of the base substrate;

S2, at least two first electrodes are formed on one side away from the base substrate, and the at least two first electrodes are provided at intervals, so that an interval region is formed between adjacent first electrodes;

S3, a second groove recessed inwardly is formed in the insulating layer on the interval region between the adjacent first electrodes.

S4, an isolation post is formed on one side of each first electrode away from the base substrate, each isolation post is located on one side of a first electrode close to the interval region, so that adjacent isolation posts form a first groove in the interval region, and the first groove and the second groove are combined to form the isolation groove.

An embodiment of the present disclosure further provides a display device which includes the display substrate in any one of the aforementioned embodiments. The display device may be any product or component with a display function such as a mobile phone, a tablet computer, a television, a display, a laptop computer, a digital photo frame, a navigator, etc.

The drawings of the present disclosure only involve structures involved in the present disclosure, and other structures may refer to conventional designs. The embodiments of the present disclosure, and features in the embodiments may be combined with each other to obtain new embodiments if there is no conflict.

Those of ordinary skills in the art should understand that modifications or equivalent replacements may be made to the technical solutions of the present disclosure without departing from the spirit and scope of the technical solutions of the present disclosure, and shall all fall within the scope of the claims of the present disclosure.

The invention claimed is:

1. A display substrate, comprising a base substrate and a plurality of first electrodes provided at intervals on the base substrate, wherein a pixel film layer is provided on the first electrodes, an interval region is formed between adjacent first electrodes, isolation posts are provided on one side of the first electrodes close to the interval region, and an isolation groove is formed between the isolation posts on the adjacent first electrodes, the pixel film layer comprises a charge generation layer provided on the first electrodes, a light-emitting layer provided on the charge generation layer and a second electrode provided on the light-emitting layer, a minimum distance between a surface of the charge generation layer on a side away from the base substrate and a surface of the base substrate is less than a maximum distance between a surface of the isolation posts on a side away from the base substrate and the surface of the base substrate, and the isolation groove electrically cut offs the charge generation layer on the adjacent first electrodes, a surface of the light-emitting layer on a side away from the base substrate is higher than the surface of the isolation posts on the side away from the base substrate, and the second electrode on the adjacent first electrodes is an integrated structure, an orthographic projection of the isolation posts on the base substrate is fully within an orthographic projection of the first electrodes on the base substrate.

2. The display substrate according to claim 1, wherein the isolation posts are provided on one side of the first electrodes away from the base substrate.

3. The display substrate according to claim 2, wherein an isolation post has a first sidewall on one side close to the isolation groove, and an included angle between the first sidewall and the base substrate is not less than 80 degrees.

4. The display substrate according to claim 2, wherein an isolation post has a second sidewall on one side away from the isolation groove, and an internal angle between the second sidewall and a surface of the first electrodes away from the base substrate is less than 60 degrees.

5. The display substrate according to claim 2, wherein a distance between a surface of an isolation post on one side away from the base substrate and a surface of a first electrode on the side away from the base substrate is 200 angstroms to 2000 angstroms.

6. The display substrate according to claim 2, wherein the base substrate comprises at least two sub-pixel regions and a non-display region located between adjacent sub-pixel regions, and an orthographic projection of the isolation posts on the base substrate overlaps with an orthographic projection of the non-display region on the base substrate.

7. The display substrate according to claim 2, wherein the charge generation layer is provided on the side of the first electrodes away from the base substrate, and the surface of the charge generation layer on the side away from the base substrate is not higher than a surface of an isolation post on the side away from the base substrate.

8. The display substrate according to claim 7, wherein the light-emitting layer is provided on one side of the charge generation layer away from the base substrate and the second electrode is provided on one side of the light-emitting layer away from the base substrate.

9. The display substrate according to claim 2, wherein an insulating layer covering the base substrate is provided between the first electrodes and the base substrate, and a thickness of the pixel film layer is equal to a sum of a thickness of the insulating layer and a thickness of a first electrode.

10. The display substrate according to claim 1, wherein an insulating layer covering the base substrate is provided between the first electrodes and the base substrate, and the isolation groove recessed inwardly is formed on the insulating layer on the interval region between the adjacent first electrodes.

11. The display substrate according to claim 10, wherein the isolation groove has a sidewall and a bottom wall, and an included angle between the sidewall and the bottom wall is not less than 80 degrees.

12. The display substrate according to claim 10, wherein a depth of the isolation groove is not larger than 2000 angstroms.

13. The display substrate according to claim 1, wherein the isolation posts are provided on the side of the first electrodes away from the base substrate, a first groove is formed in the interval region between adjacent isolation posts, an insulating layer covering the base substrate is provided between the first electrodes and the base substrate, the insulating layer on the interval region between the adjacent first electrodes is provided with a second groove recessed inwardly, the first groove and the second groove are combined to form the isolation groove.

14. A display device, comprising the display substrate according to claim 1.

15. A display device, comprising the display substrate according to claim 2.

16. A display device, comprising the display substrate according to claim 3.

17. A display device, comprising the display substrate according to claim 4.

18. A display device, comprising the display substrate according to claim 5.

19. A display device, comprising the display substrate according to claim 6.

20. A display device, comprising the display substrate according to claim 7.

* * * * *